US010574202B2

(12) United States Patent
Takano et al.

(10) Patent No.: US 10,574,202 B2
(45) Date of Patent: Feb. 25, 2020

(54) ELECTRONIC PACKAGE INCLUDING CAVITY FORMED BY REMOVAL OF SACRIFICIAL MATERIAL FROM WITHIN A CAP

(71) Applicant: SKYWORKS FILTER SOLUTIONS JAPAN CO., LTD., Kadoma-Shi (JP)

(72) Inventors: Atsushi Takano, Osaka-Fu (JP);
Mitsuhiro Furukawa, Hyogo-Ken (JP);
Ichiro Kameyama, Osaka-Fu (JP);
Tetsuya Uebayashi, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 323 days.

(21) Appl. No.: 15/472,461

(22) Filed: Mar. 29, 2017

(65) Prior Publication Data
US 2017/0288627 A1      Oct. 5, 2017

Related U.S. Application Data

(60) Provisional application No. 62/317,240, filed on Apr. 1, 2016.

(51) Int. Cl.
| | | |
|---|---|---|
| H01L 41/053 | (2006.01) | |
| B81B 1/00 | (2006.01) | |
| H03H 9/17 | (2006.01) | |
| H03H 3/007 | (2006.01) | |
| B81C 1/00 | (2006.01) | |
| H03H 9/19 | (2006.01) | |
| H03H 3/00 | (2006.01) | |

(Continued)

(52) U.S. Cl.
CPC ........... *H03H 3/0072* (2013.01); *B81B 1/002* (2013.01); *B81C 1/00087* (2013.01); *H03H 9/171* (2013.01); *H03H 9/19* (2013.01); *B81B 2201/0271* (2013.01); *B81B 2203/0353* (2013.01); *B81B 2207/09* (2013.01); *B81C 2201/013* (2013.01); *H03H 9/54* (2013.01); *H03H 9/64* (2013.01)

(58) Field of Classification Search
CPC ........ H03H 3/0072; H03H 9/171; H03H 9/19; H03H 9/54; H03H 9/64; B81B 1/002; B81B 2201/0271; B81B 2203/0353; B81B 2207/09; B81C 1/00087; B81C 201/013
USPC .......................... 310/311–371, 800; 257/170
See application file for complete search history.

(56) References Cited

U.S. PATENT DOCUMENTS

2009/0101383 A1* 4/2009 Miyagi ................. B81B 3/0078
174/50.5
2009/0188709 A1* 7/2009 Kojima ............... B81C 1/00476
174/260

(Continued)

*Primary Examiner* — Thomas M Dougherty
(74) *Attorney, Agent, or Firm* — Lando & Anastasi, LLP

(57) ABSTRACT

A method of fabricating an electronic component includes forming a functional unit on a main surface of a substrate, forming a sacrificial layer covering the functional unit on the main surface, forming a cap layer covering the sacrificial layer, the cap layer forming a periphery enclosing the cavity on the main surface, forming holes through the cap layer, forming a cavity by removing the sacrificial layer using a wet etching process through the holes, the holes including a peripheral hole communicating an inside of the cavity with an outside of the cavity along the main surface, and forming a first resin layer covering the cap layer and the main surface.

20 Claims, 7 Drawing Sheets

(51) Int. Cl.
*H03H 9/54* (2006.01)
*H03H 9/64* (2006.01)

(56) References Cited

U.S. PATENT DOCUMENTS

| | | |
|---|---|---|
| 2012/0049390 A1* | 3/2012 | Shimooka ............ B81C 1/00333 257/790 |
| 2014/0284729 A1 | 9/2014 | Obara et al. |
| 2015/0170997 A1 | 6/2015 | Nakamura |

* cited by examiner

ELECTRONIC PACKAGE INCLUDING CAVITY FORMED BY REMOVAL OF SACRIFICIAL MATERIAL FROM WITHIN A CAP

CROSS-REFERENCE TO RELATED APPLICATIONS

This application claims the benefit under 35 U.S.C. § 119(e) of co-pending U.S. Provisional Application No. 62/317,240 titled "ELECTRONIC PACKAGE INCLUDING CAVITY FORMED BY REMOVAL OF SACRIFICIAL MATERIAL FROM WITHIN A CAP" filed on Apr. 1, 2016, which is herein incorporated by reference in its entirety for all purposes.

BACKGROUND

Electronic components including a hollow or cavity sealing structure for MEMS (Microelectromechanical System) devices may be subjected to face-down mounting on printed circuit boards via solder bumps and then resin sealed and packaged by transfer molding. The packaged component can be provided as an electronic device.

US Patent Application Publication No. US2014/284729A1 discloses a technology for manufacturing such an electronic component, according to which a sacrificial layer of organic material is formed on a substrate, a silicon oxide film is formed using a chemical vapor deposition (CVD) process to cover the sacrificial layer, and then the sacrificial layer is removed by ashing under an elevated temperature to form a cavity. US Patent Application Publication No. US2015/170997A1 discloses a technology according to which a sacrificial layer of organic material is similarly formed on a substrate, a silicon oxide film is formed to cover the sacrificial layer, and then the sacrificial layer is removed using a wet etching process via perforations provided through the silicon oxide film.

SUMMARY

Aspects and embodiments disclosed herein relate to a packaged electronic component including a hollow sealing structure for a MEMS device, for example, a surface acoustic wave (SAW) element or a film bulk acoustic resonator (FBAR) including a mechanically movable portion, an electronic device including the electronic component, and manufacturing methods thereof.

A substrate formed of dielectric material for a MEMS device may be easily cracked due to rapid temperature changes caused in heating and cooling processes. Accordingly, the temperature changes may be suppressed by slow heating and slow cooling during thermal processes. This slow heating and slow cooling may cause the device manufacturing productivity to be lowered by increasing the time required to perform the thermal processes. Therefore, it may be desirable to perform such manufacturing processes consistently under low temperatures. Further, although the wet etching process disclosed in US Patent Application Publication No. US2015/170997A1 may be performed under low temperatures, the etching solution sometimes remains within a cavity covered by a film. Perforations provided through the film to facilitate the etching solution draining away may decrease the structural strength of the film.

In view of the aforementioned circumstances, aspects and embodiments disclosed herein provide an electronic component, an electronic device, and manufacturing methods thereof for reducing the amount of etching solution remaining within a cavity for a MEMS device due to a wet etching process for removing a sacrificial layer and ensuring the structural strength of the film defining the cavity even when perforations are provided in the film.

An electronic component according to a first aspect may be fabricated using a method including forming a functional unit on a main surface of a substrate, forming a sacrificial layer covering the functional unit on the main surface, forming a cap layer covering the sacrificial layer, the cap layer forming a periphery enclosing the cavity on the main surface, forming holes through the cap layer, forming a cavity by removing the sacrificial layer using a wet etching process through the holes, the holes including peripheral holes communicating between inside the cavity and outside the cavity along the main surface on the periphery, and forming a resin layer covering the cap layer and the main surface.

In some embodiments, the cap layer includes a rectangular periphery, a peripheral hole being formed at each one of four corners of the rectangular periphery. The sacrificial layer may include organic resin. The organic resin may include photosensitive novolac. The cap layer may include silicon dioxide formed using a tetraethyl orthosilicate chemical vapor deposition (TEOS-CVD) process. The cap layer may include carbon. The functional unit may include a SAW element or a FBAR having a mechanically movable portion. The substrate may include dielectric material.

A method of manufacturing an electronic device according to another aspect may include preparing an electronic component by forming a sacrificial layer covering a functional unit formed on a main surface of a first substrate, forming a cap layer covering the sacrificial layer, forming holes through the cap layer, forming a cavity by removing the sacrificial layer using a wet etching process through the holes, the holes including a peripheral hole communicating an inside of the cavity with an outside of the cavity along the main surface on the periphery, the cap layer forming a periphery enclosing the cavity on the main surface; forming a second resin layer covering the cap layer and the main surface; and mounting the electronic component to a second substrate to form the electronic device.

An electronic component according to another aspect may include a substrate having a main surface on which a functional unit is formed, a cap layer defining a cavity enclosing and covering the functional unit, the cap layer forming a periphery enclosing the cavity on the main surface, the cap layer being provided with holes, the holes including peripheral holes communicating the cavity with an outside along the main surface on the periphery, and a resin layer covering the cap layer and the main surface.

In some embodiments, the cap layer includes a rectangular periphery, a peripheral hole being formed at each one of four corners of the rectangular periphery. The cap layer may include silicon dioxide containing carbon. The functional unit may include a SAW element or a FBAR having a mechanically movable portion. The substrate may include dielectric material.

An electronic device according to another aspect may include a first substrate, an electronic component including a second substrate having a main surface on which a functional unit is formed, a cap layer defining a cavity enclosing and covering the functional unit, and a first resin layer covering the cap layer and the main surface, the cap layer forming a periphery enclosing the cavity on the main surface, the cap layer being provided with holes, the holes including a peripheral hole communicating an inside of the cavity with an outside of the cavity along the main surface on the periphery, and a second resin layer sealing the first substrate and the electronic component.

In some embodiments, the functional unit is one of a surface acoustic wave (SAW) element or a film bulk acoustic resonator (FBAR).

In some embodiments, the second substrate includes a piezoelectric material.

In some embodiments, the cap layer includes silicon dioxide and between zero and 20 atomic percent carbon relative to silicon in the silicon dioxide.

In some embodiments, the cap layer further includes perforations formed in a ceiling of the cap layer.

In some embodiments, the first resin layer includes one or more bores and a solder layer having a thickness less than a thickness of the first resin layer disposed within the one or more bores. The solder layer may be in electrical communication with the functional unit through a metal layer disposed on the main surface of the second substrate.

In accordance with aspects and embodiments disclosed herein, a sacrificial layer can be removed using a wet etching process, which may be undertaken under low temperatures. Therefore, substrate cracking can be prevented and higher productivity can be achieved. In addition, forming a peripheral hole along the periphery of the cap layer on the substrate can reduce the amount of the etching solution remaining within the cavity due to the wet etching process and can ensure the structural strength of the cap layer by reducing the number of holes.

When a rectangular cap layer is formed on the substrate, positioning the peripheral holes at the four corners can further reduce the residue of the etching solution and can ensure the structural strength of the cap layer by reducing the number of holes. Using novolac resin as organic resin for the sacrificial layer can allow the sacrificial layer to be formed and removed under low temperatures.

Using a tetraethyl orthosilicate chemical vapor deposition (TEOS-CVD) process can allow the cap layer to be formed under low temperatures. The inclusion of carbon in silicon dioxide comprising the cap layer can adjust the linear expansion coefficient to reduce the possibility of delamination occurring between the resin layer and the cap layer.

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Embodiments directed to an electronic component, an electronic device, and manufacturing methods thereof will now be described with reference to the accompanying drawings. Although a SAW element is illustrated as an example of a MEMS device, aspects and embodiments disclosed herein are not limited to the SAW element but can be applied to a FBAR and other MEMS devices.

Figure 1A:
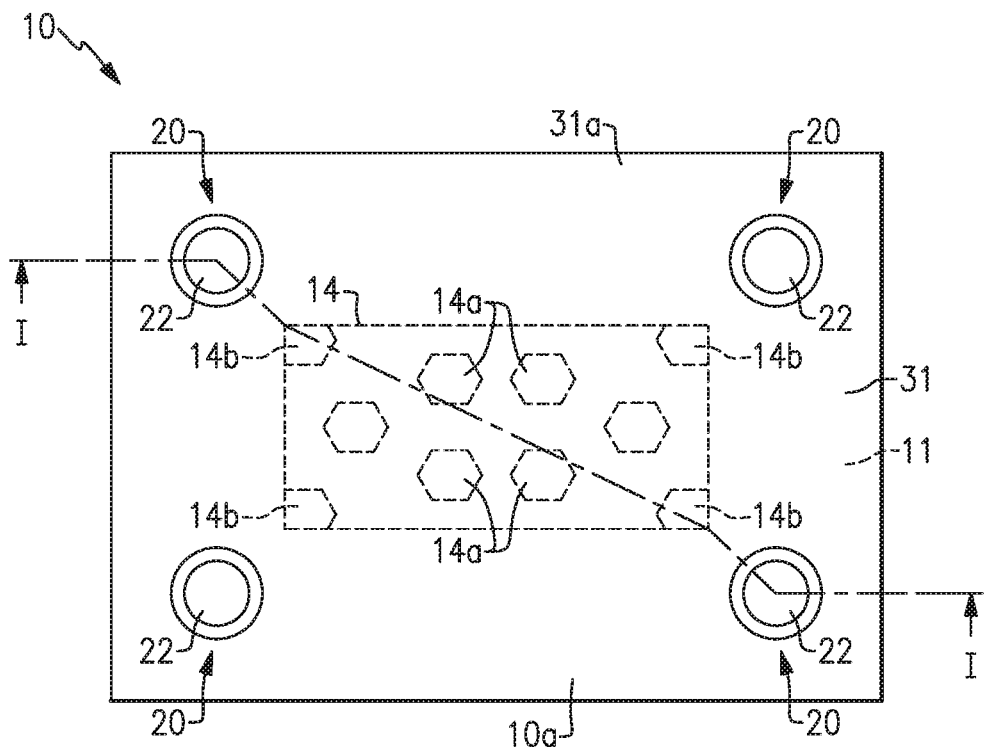
FIG. 1A is a bottom plan view schematically showing an electronic component according to an exemplary embodiment.
Figure 1B:
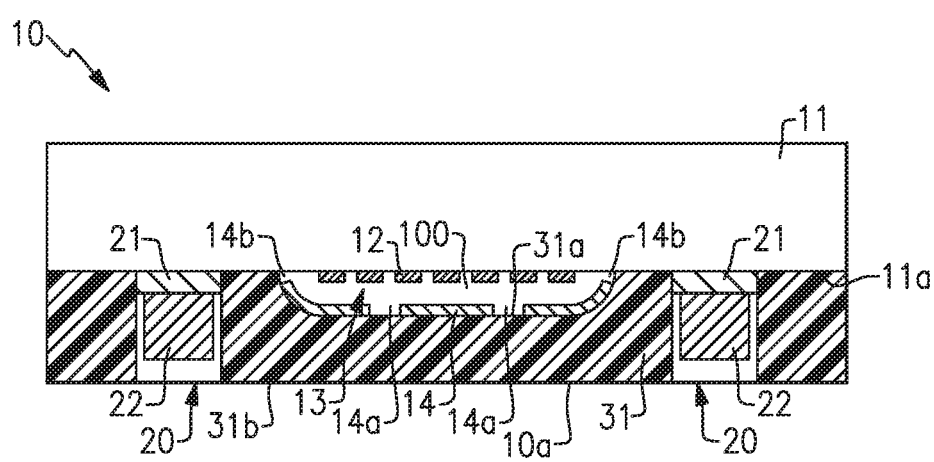
FIG. 1B is a cutaway front view schematically showing the electronic component of FIG. 1A.

FIGS. 1A and 1B schematically show a configuration of an embodiment of an electronic component 10. FIG. 1A is a bottom plan view of the electronic component 10 and FIG. 1B is a cutaway front view of the electronic component 10 taken along line I-I of FIG. 1A.

The electronic component 10 includes a substrate 11 formed of dielectric material. A functional unit 13, for example, a SAW element is formed on a main surface 11a of the substrate 11. The functional unit 13 includes a mechanically movable portion having an interdigital transducer (IDT) electrode 12, a SAW propagation path (not shown), and the like. The dielectric material of the substrate 11 may include a piezoelectric single crystal, for example, lithium tantalate or lithium niobate.

The functional unit 13 formed on the main surface 11a of the substrate 11 is enclosed by a cavity 100. The cavity 100 is defined by a cap layer 14 formed of silicon dioxide. A first resin layer 31 covers the main surface 11a of the substrate 11 and the cap layer 14. The cap layer 14 forms a periphery enclosing the cavity 100 on the main surface 11a. The cavity 100 allows the mechanically movable portion to properly operate in the functional unit 13.

The silicon dioxide constituting the cap layer 14 may contain carbon at a certain concentration. The cap layer 14 has a linear expansion coefficient adjusted to be close to that of the first resin layer 31 by containing a suitable amount of carbon. It is to be appreciated that the carbon content of the cap layer 14 may be 20 atomic percent or less relative to silicon because carbon content greater than this amount may degrade the crystallinity of silicon dioxide and decrease the strength of the cap layer 14. Because of the adjustment of the linear expansion coefficient, delamination between the cap layer 14 and the first resin layer 31 can be prevented. Further, inclusion of carbon in the cap layer 14 may improve the adhesion between the cap layer 14 and the first resin layer 31 and therefore increase the heat resistance of the electronic component 10. Still further, the inclusion of carbon may increase the moisture permeability of the cap layer 14 to reduce the amount of moisture remaining within the cavity 100 after fabrication.

The cap layer 14 includes holes 14a, 14b, through which the cavity 100 can communicate with the outside via the cap layer 14. The holes 14a, 14b may include perforations 14a formed only through a ceiling of the cap layer 14. Further, the holes 14a, 14b may include peripheral holes 14b formed along the main surface 11a of the substrate 11. The peripheral holes 14b are disposed on a periphery of the cap layer 14 enclosing the cavity 100 on the main surface 11a. The cavity 100 can communicate with the outside through the peripheral holes 14b when the cap layer 14 is etched as described later. As shown in FIG. 1B, the edges of the peripheral holes 14b are defined not only by the cap layer 14 but also by the main surface 11a of the substrate 11.

As shown in FIG. 1A, when the substrate 11 of the electronic component 10 is rectangular in shape, the cap layer 14 may be formed similarly as rectangular in shape and positioned substantially at the center of the substrate 11. The perforations 14a are generally arranged over a central region of the cap layer 14, whereas each peripheral hole 14b is formed at each one the four corners of the rectangle-shaped cap layer 14. Line I-I as shown in FIG. 1A passes across the peripheral holes 14b diagonally positioned in the cap layer 14.

The peripheral holes 14b can form flow paths along the main surface 11a of the substrate 11. Etching solution may flow through the flow paths from the inside of the cap layer 14 during a wet etching process as described below. As a result, the reflux of the etching solution within the cap layer 14 can be facilitated and the etching process can be accelerated.

Further, the peripheral holes 14b allow the etching solution to easily drain away therethrough during the wet etching process such that the amount of the etching solution remaining within the cavity 100 after the etching process can be reduced. Accordingly, the number of perforations 14a formed through the cap layer 14 to facilitate the flow of the etching solution can be reduced. Thus, the structural strength of the cap layer 14 can be ensured.

The electronic component 10 is provided with a first resin layer 31 to cover the main surface 11a and the cap layer 14. The first resin layer 31 may be formed of thermoset resin material, for example, polyimide or epoxy, in which inorganic fillers, for example, silica and/or alumina may be dispersed.

The first resin layer 31 has a first surface 31a in contact with the main surface 11a of the substrate 11 and a flat second surface 31b in parallel with the main surface 11a. The second surface 31b is a surface opposed to the first surface 31a. The first resin layer 31 is provided with bores 20 opening to the second surface 31b as shown in FIG. 1B. Each bore 20 is formed to extend between the second surface 31b and the main surface 11a and may have a cylindrical internal surface with a certain diameter. The bore 20 may have a diameter sufficient to accommodate an electrode pad formed on a printed circuit board as described below. Further, when the substrate 11 is formed rectangular in shape, each bore 20 may be positioned around each one of the four corners as shown in FIG. 1A.

It is to be appreciated that the second surface 31b of the first resin layer 31 corresponds to a bottom surface 10a of the electronic component 10. The second surface 31b of the first resin layer 31 is also referred to as a bottom surface 10a of the electronic component 10 hereinafter.

The bore 20 is provided with a metal layer 21 having a certain thickness from the main surface 11a of the substrate 11. The metal layer 21 is connected to the functional unit 13 formed on the main surface 11a via wiring (not shown).

A solder layer 22 is formed in the bore 20 on the metal layer 21. The solder layer 22 has a thickness such that the solder layer 22 does not to extend beyond the second surface 31b of the first resin layer 31. This configuration allows an electrode pad 53 formed on a printed circuit board 51 to be housed into the bore 20 (see FIG. 2). The solder layer 22 may have a cylindrical shape, the diameter of which is configured to correspond to that of the cylindrical shape of the bore 20. There may be a gap provided between the periphery of the solder layer 22 and a peripheral surface defined by the bore 20. The solder layer 22 is connected to the functional unit 13 via the metal layer 21.

Figure 2:
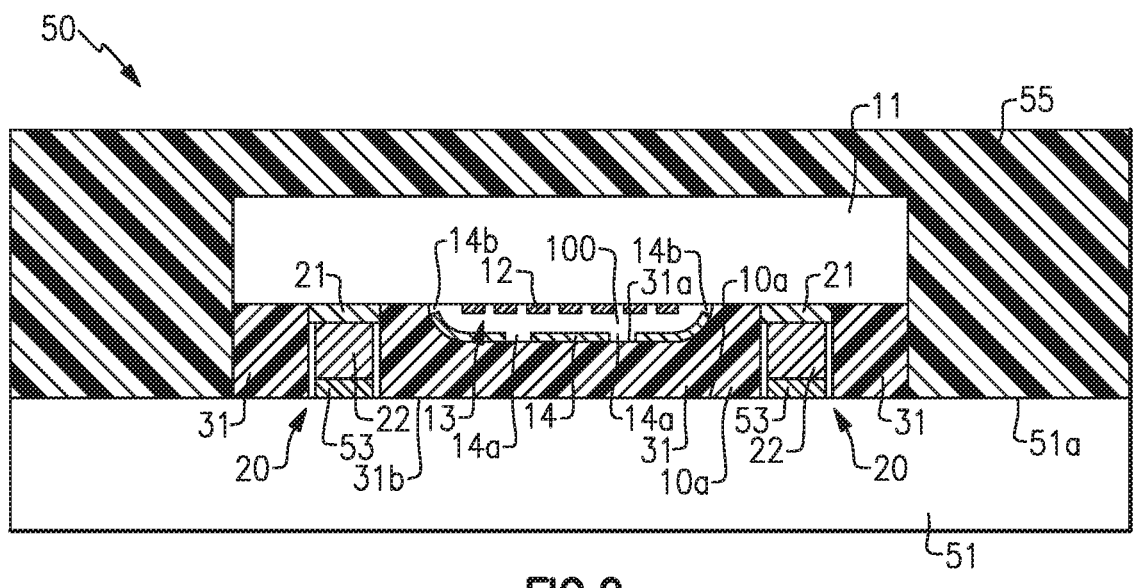
FIG. 2 is a cutaway front view of an electronic device according to an exemplary embodiment.

FIG. 2 is a cutaway front view of an embodiment of an electronic device 50. The cutaway front view shows a cutaway portion of the electronic device 50 taken along an extension of line I-I in FIG. 1A. The electronic device 50 is fabricated in such a manner that the electronic component 10 is mounted on the printed circuit board 51 and then sealed with a second resin layer 55.

The printed circuit board 51 may contain halogen at a concentration of, for example, 100 ppm or less to closely match the linear expansion coefficient of the electronic component 10. Closely matching the linear expansion coefficients of the printed circuit board 51 and the electronic component 10 may prevent a break of the connection between the printed circuit board 51 and the electronic component 10 such as a delamination between the solder layer 22 and the electrode pad 53 due to heating and cooling processes.

The printed circuit board 51 includes a flat main surface 51a. The main surface 51a is provided with electrode pads 53, each of which is disposed at a location corresponding to the bore 20 of the electronic component 10. The electronic component 10 is positioned such that a corresponding electrode pad 53 of the printed circuit board 51 can be housed into the bore 20. The solder layer 22 formed on the metal layer 21 of the bore 20 is welded onto the electrode pad 53. It is to be appreciated that the solder layer 22 may have a thickness sufficient to provide an amount of solder sufficient to be used for the welding onto the electrode pad 53.

The welding between the solder layer 22 and the electrode pad 53 is performed by heating the electronic component 10 and the printed circuit board 51 up to a certain temperature, maintaining the temperature for a certain duration of time, and melting the solder layer 22. After the solder layer 22 and the electrode pad 53 are welded, the electronic component 10 and the printed circuit board 51 are cooled. At the time of cooling, the melted solder layer 22 contracts in volume due to the solidification.

The volume contraction may apply a contraction force between the solder layer 22 and the electrode pad 53 in a state that the solder layer 22 is welded and secured onto the electrode pad 53. Accordingly, the bottom surface 10a of the electronic component 10 and the main surface 51a of the printed circuit board 51 are pressure bonded to each other. Consequently, the gap between the bottom surface 10a of the electronic component 10 and the main surface 51a of the printed circuit board 51 can be significantly reduced.

The bottom surface 10a of the electronic component 10 is tightly connected to the main surface 51 of the printed circuit board 51 due to the contraction force applied between the solder layer 22 and the electrode pad 53. Therefore, the first resin layer 31 forming the cavity 100 can be supported substantially entirely by the printed circuit board 51.

The second resin layer 55 sealing the electronic component 10 onto the printed circuit board 51 is formed by transfer molding or compression molding under a temperature of 150° C. or greater and a pressure of several megapascals. The second resin layer 55 may be formed of thermoset resin material, for example, polyimide or epoxy, in which inorganic fillers, for example, silica and/or alumina may be dispersed.

The electronic component 10 has a bottom surface 10a that can be pressure bonded to the main surface 51a of the printed circuit board 51 by a contraction force created when the solder layer 22 is welded onto the electrode pad 53. Therefore, the gap between the bottom surface 10a of the electronic component 10 and the main surface 51a of the printed circuit board 51 can be significantly reduced such that the resin of the second resin layer 55 can be prevented from penetrating into the gap even under the pressure applied by transfer molding or compression molding.

For example, if the gap between the bottom surface 10a of the electronic component 10 and the main surface 51a of the printed circuit board 51 is less than the size of a filler dispersed in the resin material of the second resin layer 55, it would be impossible for the resin material to penetrate into such a gap. In addition, if the resin material of the second resin layer 55 has a thixotropic index higher than a certain value in a resin sealing process of the second resin layer 55, it would be impossible for the resin material to penetrate into such a gap. Therefore, the fillers dispersed in the second resin layer 55 may have an average size of 10 μm or greater. Further, in order to increase the thixotropic index, the content of the fillers may be 65 percent by weight or greater.

In some embodiments, the second resin layer 55 is formed by transfer molding or compression molding. Therefore, the transfer molding or compression molding that can realize a packaging process including a robust and stable resin sealing process may protect the electronic device 50 including the substrate 11 and the electronic component 10.

Figure 3A:
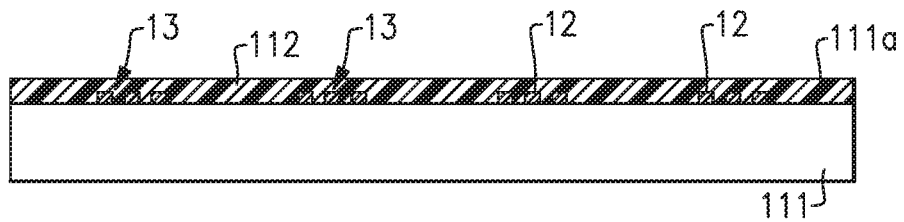
FIGS. 3A-3O illustrate a series of processes for a manufacturing method of an electronic component according to an exemplary embodiment.
Figure 3B:
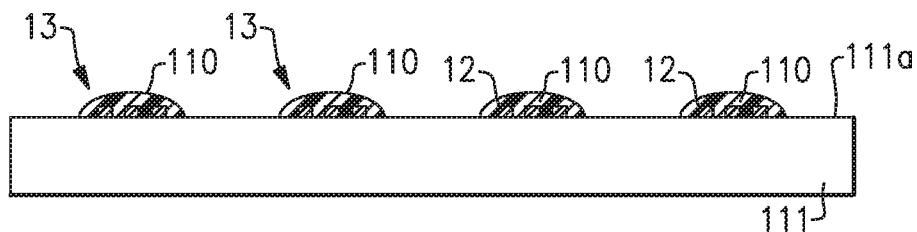

FIGS. 3A though 3O illustrate a series of processes for a manufacturing method of an electronic component 10. As shown in FIG. 3A, a functional unit 13 including an IDT electrode 12 is formed on the main surface 111a of a substrate 111 of dielectric material, and then a resin layer 112 is formed with photosensitive organic resin over the functional unit 13 on the main surface 111a of the substrate 111. Next, the resin layer 112 is exposed, developed, and etched via a mask such that, as shown in FIG. 3B, a sacrificial layer 110 covering the functional unit 13 is formed of material of the resin layer 112.

In some embodiments, novolac resin is used as the photosensitive organic resin 112. This may allow the sacrificial layer 110 to be formed under low temperatures and also allow the etching process to be performed by wet etching under low temperatures. Therefore, the temperature changes applied to the substrate 111 can be suppressed and the substrate 111 can be prevented from cracking.

Figure 3C:
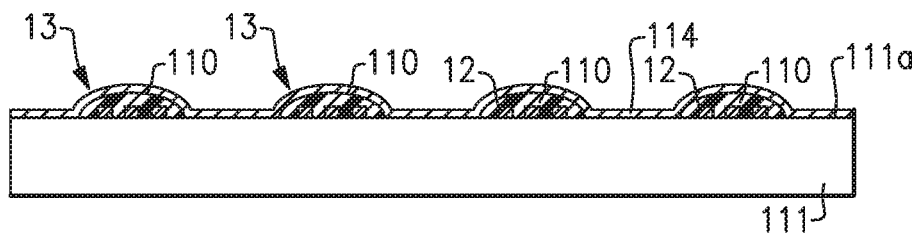

As shown in FIG. 3C, a silicon dioxide layer 114 is formed on the main surface 111a of the substrate 111 on which the sacrificial layer 110 is formed using a tetraethyl orthosilicate chemical vapor deposition (TEOS-CVD) process. The silicon dioxide layer 114 is to form a cap layer in later processes.

Utilizing a TEOS-CVD process, it is possible to form a silicon dioxide layer under lower temperatures than a conventional plasma-enhanced chemical vapor deposition (PE-CVD) process. PE-CVD conventionally uses polyimide resin for the sacrificial layer 110 because polyimide has a high temperature tolerance. Ashing may be performed for removing such high temperature tolerant polyimide.

In contrast, in some embodiments, a TEOS-CVD process may allow novolac resin, which can be removed by wet etching but has little high temperature tolerance, to be used for the sacrificial layer 110. In the TEOS-CVD process, carbon is added to the source gas such that the silicon dioxide layer 114 forming a cap layer can contain a certain concentration of carbon as described above.

Figure 3D:
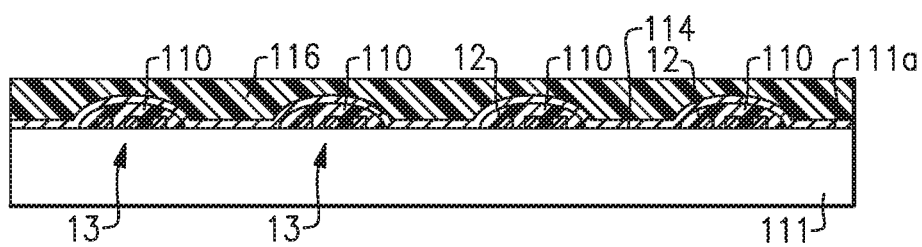

After the silicon dioxide layer 114 is formed, a resist 116 is deposited on the silicon dioxide layer 114 by spin coating as shown in FIG. 3D. Next, the resist 116 is exposed, developed, and etched via a mask.

Figure 3E:
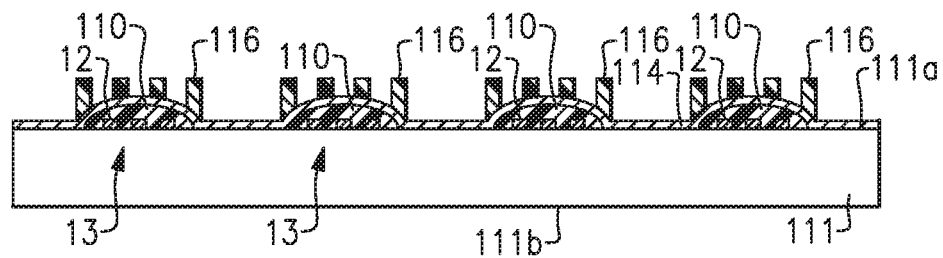

As a result, the resist 116 is provided with a pattern corresponding to cap layers having holes as shown in FIG. 3E. In some embodiments, the pattern of the resist 116 is formed to correspond to the holes including perforations 14a and peripheral holes 14b formed through the cap layer 14 as shown in FIGS. 1A and 1B.

Figure 3F:
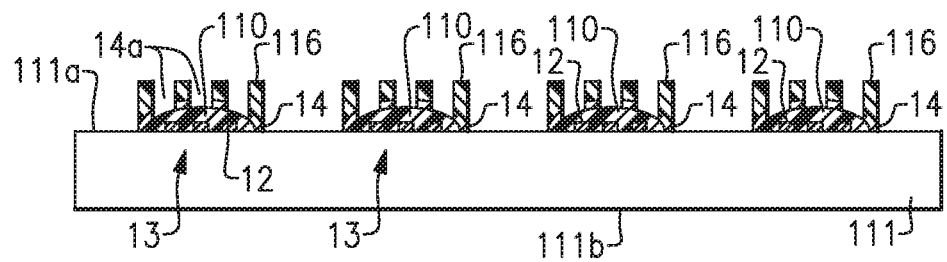
Figure 3G:
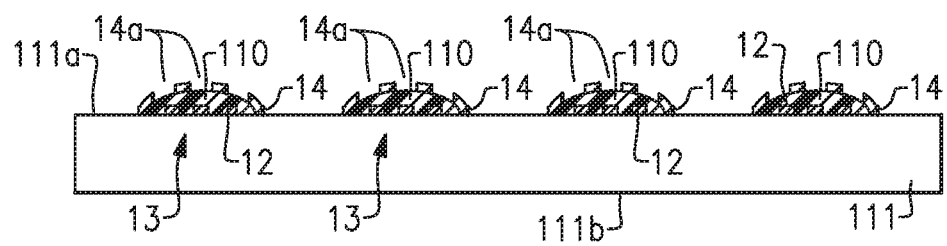

FIG. 3F shows that the silicon dioxide layer 114 is dry etched through apertures in the pattern formed by the resist 116. Portions of the silicon dioxide layer 114 other than the portions covered with the resist 116 are removed and the cap layer 14 is formed. FIG. 3G shows the cap layer 14 having an exposed surface after the removal of the resist 116.

In some embodiments, the cap layer 14 covering the functional unit 13 is provided with a plurality of types of holes. Although FIG. 3G shows the perforations 14a passing only through the cap layer 14, the peripheral holes 14b as shown in FIGS. 1A and 1B are also formed along the periphery of the cap layer 14 on the main surface 111a of the substrate 111 to pass between the cap layer 14 and the main surface 111a.

Figure 3H:
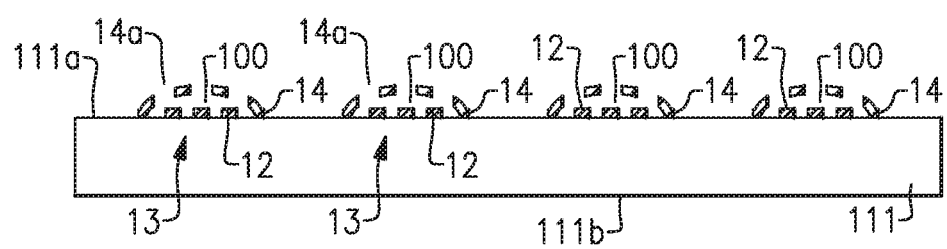

After the sacrificial layer 110 is removed as shown in FIG. 3H, the cavity 100 is formed to cover the functional unit 13. The sacrificial layer 110 formed of novolac-based photosensitive organic resin can be easily removed by wet etching. The etching solution used in the wet etching may include organic solvent, alkaline solutions, and the like.

In some embodiments, the cap layer 14 is provided with the perforations 14a passing only through the cap layer 14 as well as the peripheral holes 14b formed along the periphery of the cap layer 14 on the main surface 111a of the substrate 111. The peripheral holes 14b may facilitate the reflux of the etching solution within the cap layer 14 and the etching process can be accelerated during the process of FIG. 3H.

Further, the peripheral holes 14b may reduce the etching solution remaining within the cavity 100 after the wet etching process. Therefore, the number of the perforations 14a formed through the cap layer 14 can be less than if no peripheral holes 14b were present and, accordingly, the structural strength of the cap layer 14 can be ensured.

For example, when the cap layer 14 is formed to have a rectangular area on the main surface 111a of the substrate 111 as described above, each of the peripheral holes 14b may be positioned at each one of the four corners of the rectangular cap layer 14. The etching solution can drain away through the peripheral holes 14b formed at the four corners such that the residue of the etching solution can be further reduced. In addition, the accelerated draining of the etching solution through the peripheral holes 14b may allow a reduction in the number of perforations 14a and therefore the structural strength of the cap layer 14 can be further ensured.

It is to be appreciated that an ashing process can be added subsequent to the etching process to remove organic materials still remaining within the cavity 100.

Figure 3I:
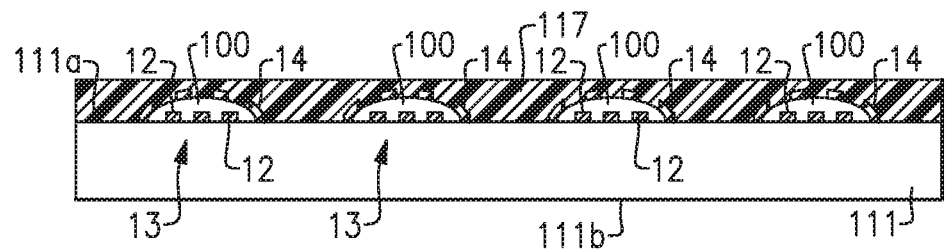

As shown in FIG. 3I, a resin layer 117 is formed by spin coating on the main surface 111a of the substrate 11 and the cap layer 14. When the thixotropic index of the resin used to form the resin layer 117 is higher than a certain value, the resin layer 117 does not penetrate into the holes of the cap layer 14, i.e., the perforations 14a and the peripheral holes 14b. The resin layer 117 may be formed of thermoset resin material, for example, polyimide or epoxy, in which inorganic fillers, for example, silica and/or alumina may be dispersed.

Figure 3J:
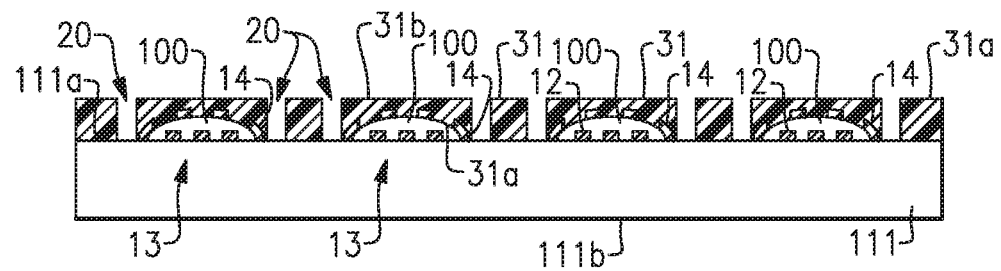

As shown in FIG. 3J, the resin layer 117 is patterned by exposing, developing, and etching of the resin layer 117. The etching of the resin layer 117 provides a first resin layer 31 including bores 20. Each bore 20 extends between the second surface 31b of the first resin layer 31 and the main surface 111a of the substrate 111.

Figure 3K:
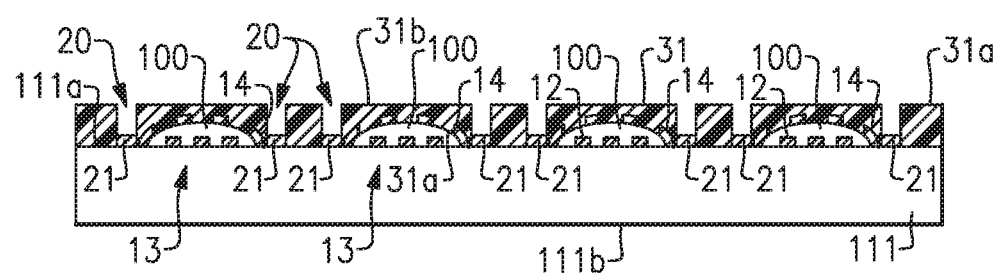
Figure 3L:
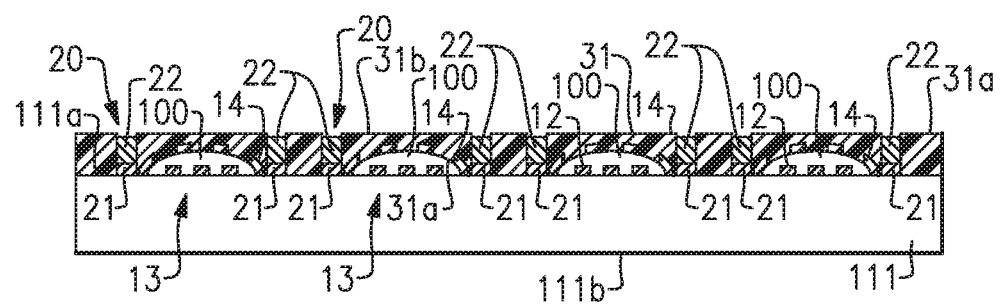

As shown in FIG. 3K, a metal layer 21 is formed in contact with the main surface 111a of the substrate 111 within the bore 20. The metal layers 21 may include copper. As show in FIG. 3L, a solder layer 22 is formed on the metal layer 21.

Figure 3M:
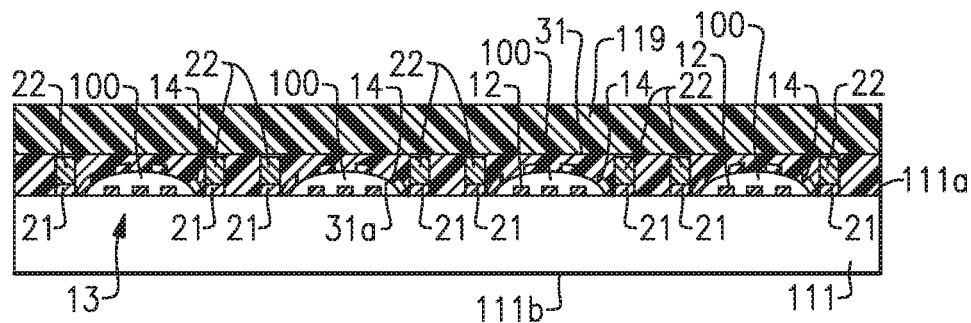
Figure 3N:
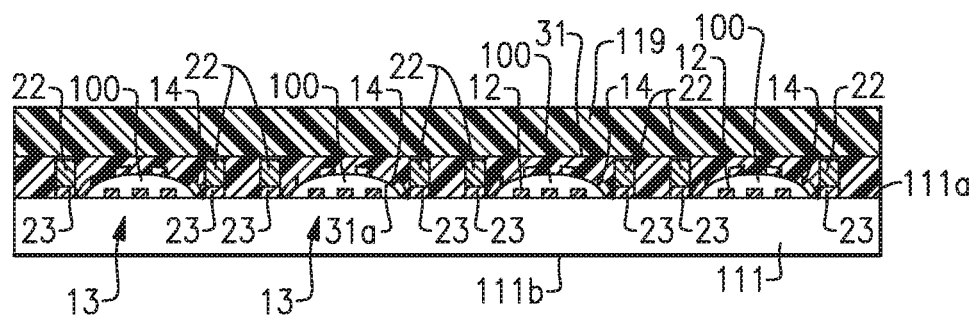

As shown in FIG. 3M, a backgrinding tape 119 is adhered onto the first resin layer 31 formed on the main surface 111a of the substrate 111. Next, a surface 111b opposed to the main surface 111a of the substrate 111 is polished until the substrate 111 has a reduced thickness as shown in FIG. 3N. In the polishing process, the backgrinding tape 119 protects structural components including the functional unit 13 formed on the main surface 111a of the substrate 111. After the polishing process is finished, the backgrinding tape 119 is removed.

Figure 3O:
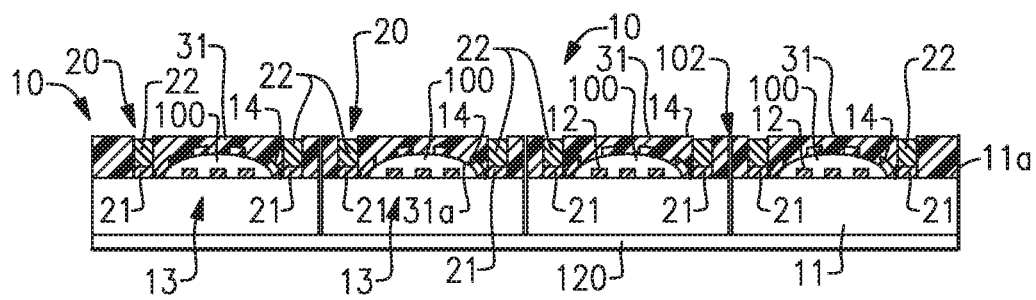

As shown in FIG. 3O, a dicing tape 120 is adhered to a rear surface 11b of the substrate 11 and then the substrate 11 is diced into separate electronic components 10.

As described above, in some embodiments, the sacrificial layer 110 is formed of novolac-based photosensitive organic resin and is removed by wet etching after the cap layer 14 is formed of carbon-containing silicon dioxide by TEOS-CVD process. Accordingly, no rapid temperature changes would be applied to the substrate 11 in the series of processes that can proceed under low temperatures. Therefore, the substrate 11 can be prevented from cracking. In addition, the working processes can proceed under low temperatures such that slow heating and slow cooling are not necessary and therefore the productivity of the manufacturing process for the electronic components 10 can be improved.

In some embodiments, the peripheral holes 14b are formed along the periphery of the cap layer 14 on the main surface 11a of substrate 11. Accordingly, the etching solution can drain away through the peripheral holes 14b during the wet etching process such that it is possible to reduce the amount of the etching solution remaining within the cavity defined by the cap layer 14. This can reduce the number of the perforations 14a formed through the cap layer 14 conventionally required for draining the etching solution and therefore the structural strength of the cap layer 14 can be ensured.

In some embodiments, the linear expansion coefficient of the cap layer 14 may be adjusted to be close to that of the first resin layer 31 in contact with the cap layer 14 by adding a suitable amount of carbon to the silicon dioxide forming the cap layer 14. This can improve the adhesion between the cap layer 14 and the first surface 31a of the first resin layer 31 in contact with the cap layer 14 and can prevent the delamination therebetween such that the heat resistance of the electronic components 10 can be improved. In addition, the inclusion of carbon can improve the moisture permeability of the cap layer 14 to reduce the amount of moisture remaining within the cavity 100.

Although the electronic component 10 of the present embodiment can be manufactured by an aforementioned series of processes, these processes are directed merely to an example of the manufacturing method of the electronic component 10.

Figure 4:
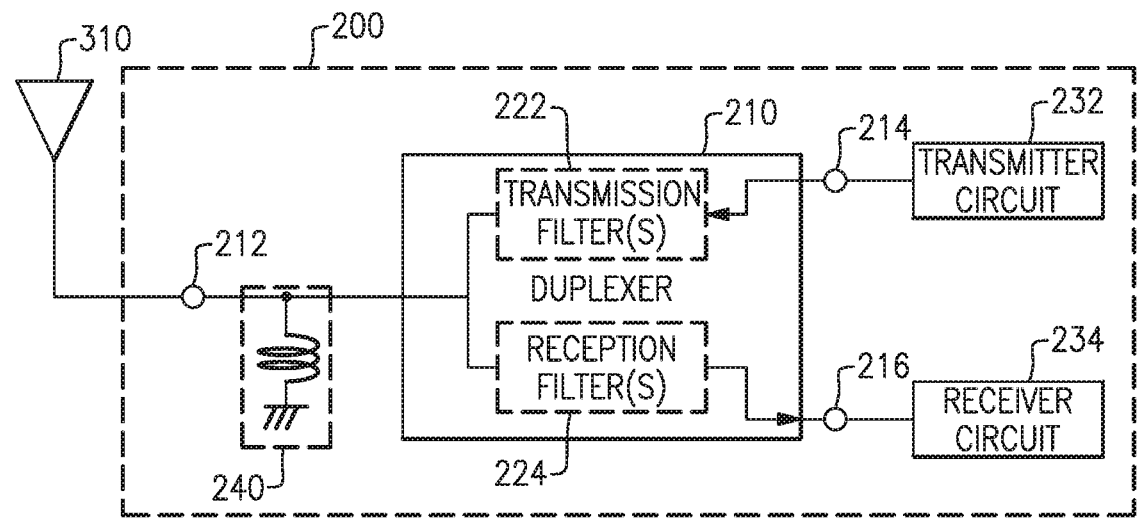
FIG. 4 is a block diagram of an example of a module which may be used in an electronic device.

Referring to FIG. 4, there is illustrated a block diagram of one example of a front-end module 200, which may be used in an electronic device such as a wireless communications device (e.g., a mobile phone) for example. The front-end module 200 includes an antenna duplexer 210 having a common node 212, an input node 214, and an output node 216. An antenna 310 is connected to the common node 212. The front-end module 200 further includes a transmitter circuit 232 connected to the input node 214 of the duplexer 210 and a receiver circuit 234 connected to the output node 216 of the duplexer 210. The transmitter circuit 232 can generate signals for transmission via the antenna 310, and the receiver circuit 234 can receive and process signals received via the antenna 310. In some embodiments, the receiver and transmitter circuits are implemented as separate components, as shown in FIG. 4, however in other embodiments these components may be integrated into a common transceiver circuit or module. As will be appreciated by those skilled in the art, the front-end module 200 may include other components that are not illustrated in FIG. 4 including, but not limited to, switches, electromagnetic couplers, amplifiers, processors, and the like.

The antenna duplexer 210 may include one or more transmission filters 222 connected between the input node 214 and the common node 212, and one or more reception filters 224 connected between the common node 212 and the output node 216. The passband(s) of the transmission filter(s) are different from the passband(s) of the reception filters. Each of the transmission filter(s) 222 and the reception filter(s) 224 may include an embodiment of an electronic component 10 as disclosed herein. An inductor or other matching component 240 may be connected at the common node 212.

In certain examples, the SAW elements used in the transmission filter 222 or the reception filter 224 are disposed on a single piezoelectric substrate. This structure reduces the effect of changes in temperature upon the frequency responses of the respective filter, in particular, reducing degradation in the passing or attenuation characteristics due to changes in the temperature, because each SAW element changes similarly in response to changes in the ambient temperature. In addition, this arrangement may also allow the transmission filter 222 or reception filter 224 to have a small size.

Figure 5:
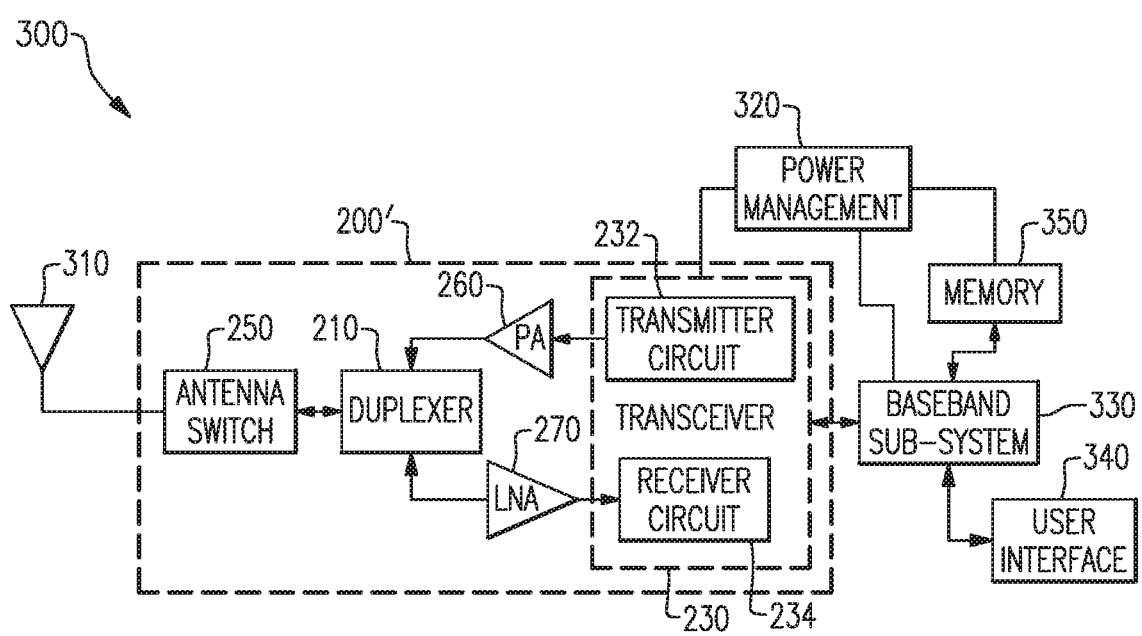
FIG. 5 is a block diagram of an embodiment of a wireless device.

FIG. 5 is a block diagram of one example of a wireless device 300 including the antenna duplexer 210 shown in FIG. 4. The wireless device 300 can be a cellular phone, smart phone, tablet, modem, communication network or any other portable or non-portable device configured for voice or data communication. The wireless device 300 can receive and transmit signals from the antenna 310. The wireless device includes an embodiment of a front-end module 200' similar to that discussed above with reference to FIG. 4. The front-end module 200' includes the duplexer 210, as discussed above. In the example shown in FIG. 5 the front-end module 200' further includes an antenna switch 250, which can be configured to switch between different frequency bands or modes, such as transmit and receive modes, for example. In the example illustrated in FIG. 5, the antenna switch 250 is positioned between the duplexer 210 and the antenna 310; however, in other examples the duplexer 210 can be positioned between the antenna switch 250 and the antenna 310. In other examples the antenna switch 250 and the duplexer 210 can be integrated into a single component.

The front end module 200' includes a transceiver 230 that is configured to generate signals for transmission or to process received signals. The transceiver 230 can include the transmitter circuit 232, which can be connected to the input node 214 of the duplexer 210, and the receiver circuit 234, which can be connected to the output node 216 of the duplexer 210, as shown in the example of FIG. 4.

Signals generated for transmission by the transmitter circuit 232 are received by a power amplifier (PA) module 260, which amplifies the generated signals from the transceiver 230. The power amplifier module 260 can include one or more power amplifiers. The power amplifier module 260 can be used to amplify a wide variety of RF or other frequency-band transmission signals. For example, the power amplifier module 260 can receive an enable signal that can be used to pulse the output of the power amplifier to aid in transmitting a wireless local area network (WLAN) signal or any other suitable pulsed signal. The power amplifier module 260 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier module 260 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 5, the front-end module 200' may further include a low noise amplifier module 270, which amplifies received signals from the antenna 310 and provides the amplified signals to the receiver circuit 234 of the transceiver 230.

The wireless device 300 of FIG. 5 further includes a power management sub-system 320 that is connected to the transceiver 230 and manages the power for the operation of the wireless device 300. The power management system 320 can also control the operation of a baseband sub-system 330 and various other components of the wireless device 300. The power management system 320 can include, or can be connected to, a battery (not shown) that supplies power for the various components of the wireless device 300. The power management system 320 can further include one or more processors or controllers that can control the transmission of signals, for example. In one embodiment, the baseband sub-system 330 is connected to a user interface 340 to facilitate various input and output of voice and/or data provided to and received from the user. The baseband sub-system 330 can also be connected to memory 350 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention.

What is claimed is:

1. A method of manufacturing an electronic component, the method comprising:
   forming a functional unit on a main surface of a substrate;
   forming a sacrificial layer covering the functional unit on the main surface;
   forming a cap layer covering the sacrificial layer;
   forming holes through the cap layer;
   removing the sacrificial layer using a wet etching process through the holes to form a cavity, the cap layer forming a periphery enclosing the cavity on the main surface, the holes including peripheral holes communicating between inside the cavity and outside the cavity along the main surface on the periphery; and
   forming a resin layer covering the cap layer and the main surface, the resin layer including one or more bores and a solder layer having a thickness less than a thickness of the resin layer disposed within the one or more bores.

2. The method of claim 1 wherein the cap layer includes a rectangular periphery, the peripheral holes being formed at each one of four corners of the rectangular periphery.

3. The method of claim 1 wherein the sacrificial layer includes organic resin.

4. The method of claim 3 wherein the organic resin includes photosensitive novolac.

5. The method of claim 1 wherein the cap layer includes silicon dioxide formed using a tetraethyl orthosilicate chemical vapor deposition (TEOS-CVD) process.

6. The method of claim 5 wherein the cap layer includes carbon.

7. The method of claim 1 wherein the functional unit is one of a surface acoustic wave (SAW) element or a film bulk acoustic resonator (FBAR) including a mechanically movable portion.

8. The method of claim 1 wherein the substrate includes dielectric material.

9. A method of manufacturing an electronic device, the method comprising:
   preparing an electronic component by forming a sacrificial layer covering a functional unit formed on a main surface of a first substrate;
   forming a cap layer covering the sacrificial layer;
   forming holes through the cap layer;
   forming a cavity by removing the sacrificial layer using a wet etching process through the holes, the cap layer forming a periphery enclosing the cavity on the main surface, the holes including a peripheral hole communicating an inside of the cavity with an outside of the cavity along the main surface on the periphery;
   forming a resin layer covering the cap layer and the main surface, the resin layer including one or more bores and a solder layer having a thickness less than a thickness of the resin layer disposed within the one or more bores; and
   mounting the electronic component to a second substrate to form the electronic device.

10. An electronic component comprising:
    a substrate including a main surface on which a functional unit is formed;
    a cap layer defining a cavity enclosing and covering the functional unit, the cap layer forming a periphery enclosing the cavity on the main surface, the cap layer being provided with holes, the holes including peripheral holes communicating an inside of the cavity with an outside of the cavity along the main surface on the periphery; and
    a resin layer covering the cap layer and the main surface, the resin layer including one or more bores and a solder layer having a thickness less than a thickness of the resin layer disposed within the one or more bores.

11. The electronic component of claim 10 wherein the cap layer includes a rectangular periphery, the peripheral holes being formed at each one of four corners of the rectangular periphery.

12. The electronic component of claim 10 wherein the cap layer includes silicon dioxide containing carbon.

13. The electronic component claim 10 wherein the functional unit is one of a surface acoustic wave (SAW) element or a film bulk acoustic resonator (FBAR) including a mechanically movable portion.

14. The electronic component of claim 10 wherein the substrate includes dielectric material.

15. An electronic device comprising:
a first substrate;
an electronic component including a second substrate having a main surface on which a functional unit is formed, a cap layer defining a cavity enclosing and covering the functional unit, and a first resin layer covering the cap layer and the main surface, the first resin layer including one or more bores and a solder layer having a thickness less than a thickness of the first resin layer disposed within the one or more bores, the cap layer forming a periphery enclosing the cavity on the main surface, the cap layer being provided with holes, the holes including a peripheral hole communicating an inside of the cavity with an outside of the cavity along the main surface on the periphery; and
a second resin layer sealing the first substrate and the electronic component.

16. The electronic device of claim 15 wherein the functional unit is one of a surface acoustic wave (SAW) element or a film bulk acoustic resonator (FBAR).

17. The electronic device of claim 15 wherein the second substrate includes a piezoelectric material.

18. The electronic device of claim 15 wherein the cap layer includes silicon dioxide and between zero and 20 atomic percent carbon relative to silicon in the silicon dioxide.

19. The electronic device of claim 15 wherein the cap layer further includes perforations formed in a ceiling of the cap layer.

20. The electronic device of claim 15 wherein the solder layer is in electrical communication with the functional unit through a metal layer disposed on the main surface of the second substrate.

* * * * *